United States Patent
Liu et al.

(10) Patent No.: US 10,950,576 B2
(45) Date of Patent: Mar. 16, 2021

(54) PACKAGE STRUCTURE

(71) Applicant: Taiwan Semiconductor Manufacturing Co., Ltd., Hsinchu (TW)

(72) Inventors: Tzuan-Horng Liu, Taoyuan (TW); Hsien-Wei Chen, Hsinchu (TW); Jiun-Heng Wang, Hsinchu County (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/655,266

(22) Filed: Oct. 17, 2019

(65) Prior Publication Data

US 2020/0051955 A1 Feb. 13, 2020

Related U.S. Application Data

(63) Continuation of application No. 15/980,676, filed on May 15, 2018, now Pat. No. 10,468,379.

(51) Int. Cl.
*H01L 21/66* (2006.01)
*H01L 25/065* (2006.01)
*H01L 25/00* (2006.01)
*H01L 23/00* (2006.01)
*H01L 23/498* (2006.01)
*H01L 23/522* (2006.01)

(52) U.S. Cl.
CPC .......... *H01L 25/0652* (2013.01); *H01L 22/32* (2013.01); *H01L 23/49827* (2013.01); *H01L 23/5226* (2013.01); *H01L 24/09* (2013.01); *H01L 24/32* (2013.01); *H01L 24/83* (2013.01); *H01L 25/50* (2013.01); *H01L 2224/02372* (2013.01)

(58) Field of Classification Search
CPC ................. H01L 25/0652; H01L 22/32; H01L 23/49827; H01L 23/5226; H01L 24/09
USPC ........................................... 257/782
See application file for complete search history.

(56) References Cited

U.S. PATENT DOCUMENTS

2015/0091154 A1* 4/2015 Hsu ............... H01L 23/3677
257/712

* cited by examiner

*Primary Examiner* — Elias Ullah
(74) *Attorney, Agent, or Firm* — JCIPRNET

(57) ABSTRACT

A package structure includes a substrate, a first die, a second die and a bonding die. The substrate comprises scribe regions and die regions. The die regions are spaced from each other by the scribe regions therebetween. The first die and the second die are within the die regions of the substrate. The bonding die is electrically bonded to the first die and the second die. The top surfaces of the first die and the second die are partially covered by the bonding die.

20 Claims, 16 Drawing Sheets

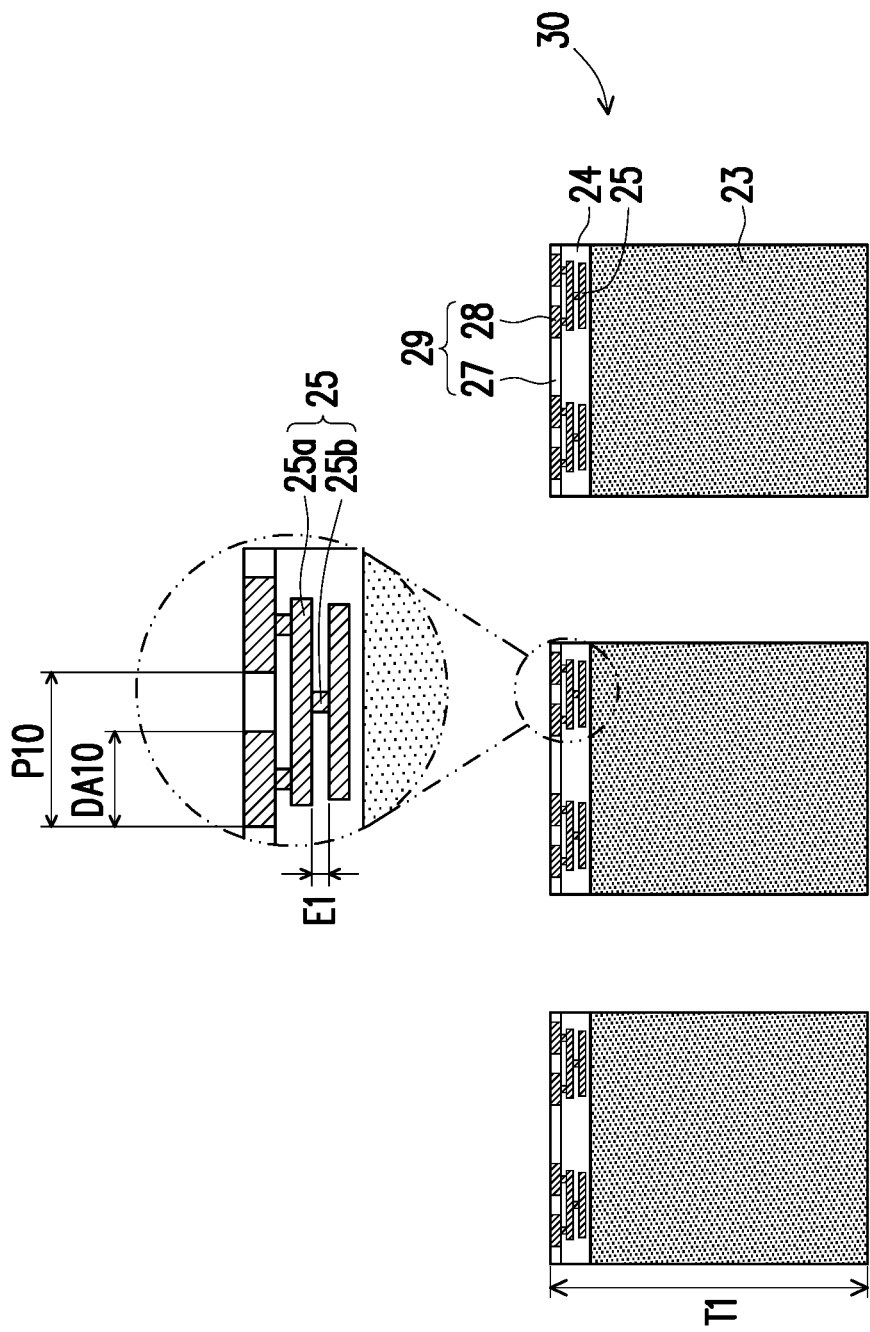

PACKAGE STRUCTURE

CROSS-REFERENCE TO RELATED APPLICATION

This application is a continuation application of and claims the priority benefit of a prior application Ser. No. 15/980,676, filed on May 15, 2018. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

3DICs provide improved integration density and other advantages. However, there are quite a few challenges to be handled for the technology of 3DICs.

BRIEF DESCRIPTION OF THE DRAWINGS

FIG. 1A to FIG. 1F are schematic cross-sectional views illustrating a method of forming a 3DIC structure according to some embodiments of the disclosure.

DETAILED DESCRIPTION

Figure 1A:
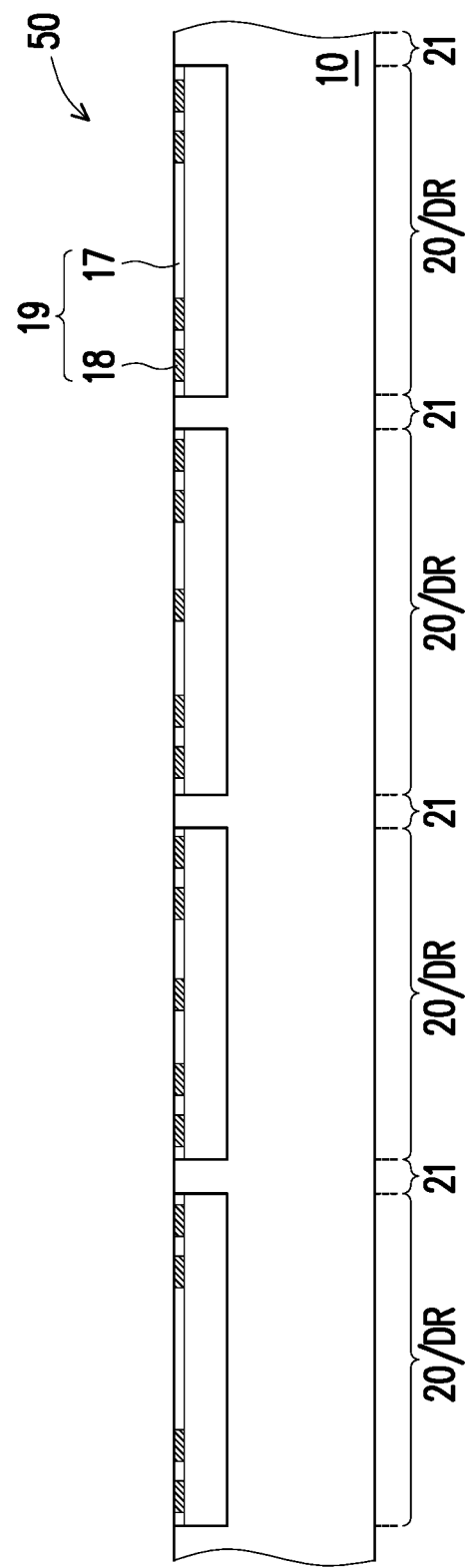

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic cross-sectional views illustrating a method of forming a package structure, such as a 3DIC structure according to some embodiments of the disclosure.

Referring to FIG. 1A, a wafer 50 including a substrate 10 is provided. The wafer 50 includes a plurality of die regions DR and a plurality of scribe regions 21 between the die regions DR. The substrate 10 is a continuous substrate extending from the die regions DR to the scribe regions 21. The die regions DR are the regions on which a plurality of dies 20 is formed. The dies 20 are spaced or electrically separated from each other through the scribe regions 21 therebetween. The dies 20 may respectively be an application-specific integrated circuit (ASIC) chip, an analog chip, a sensor chip, a wireless and radio frequency chip, a voltage regulator chip or a memory chips, for example. The dies 20 may be the same types of dies or the different types of dies. In some embodiments, the dies 20 are arranged in an array in the wafer 50. The number of the dies 20 formed in the wafer 50 shown in FIG. 1A is merely for illustration, and the disclosure is not limited thereto. The number of the dies may be adjusted according to design of products. The structure of the die 20 is described below.

FIGS. 2A to 2D are the schematic cross-sectional views respectively illustrating a die of a wafer according to some embodiments of the disclosure.

Figure 2A:
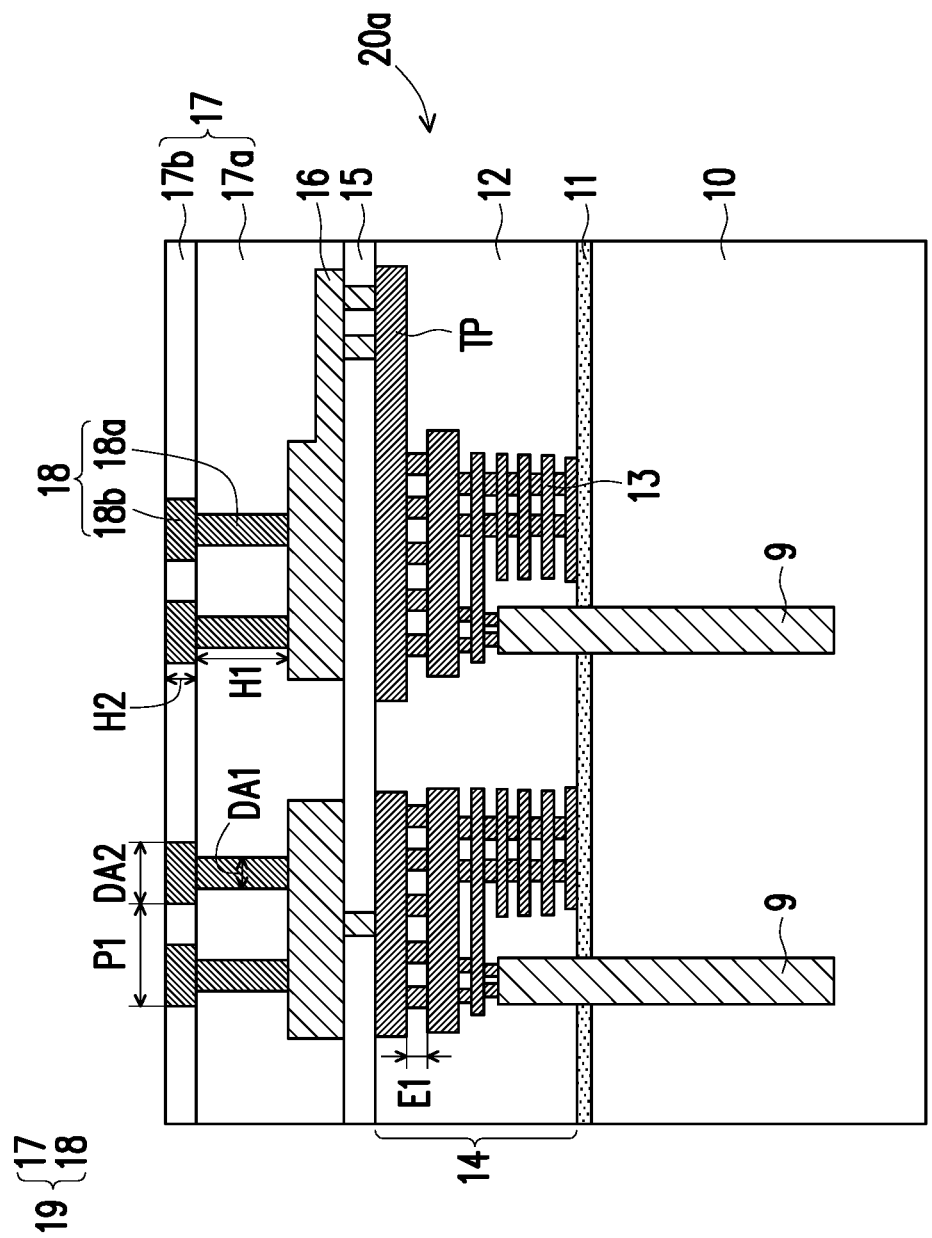
FIG. 2A to FIG. 2D are schematic cross-sectional views respectively illustrating a die of a wafer according to some embodiments of the disclosure.

Referring to FIG. 1A and FIG. 2A, in some embodiments, a die 20a of the wafer 50 includes the substrate 10, a device layer 11, an interconnect structure 14, a passivation layer 15, and a plurality of the pads 16. The substrate 10 is a semiconductor substrate such as a silicon substrate. The substrate 10 is, for example, a bulk silicon substrate, a doped silicon substrate, an undoped silicon substrate, or a silicon-on-insulator (SOI) substrate. The dopant of the doped silicon substrate may be an N-type dopant, a P-type dopant or a combination thereof. The substrate 10 may also be formed by other semiconductor materials. The other semiconductor materials include but are not limited to silicon germanium, silicon carbide, gallium arsenide, or the like. The substrate 10 includes active areas and isolation structures (not shown).

The device layer 11 includes a wide variety of devices (not shown) formed on the active areas of the substrate 10.

In some embodiments, the devices include active components, passive components, or a combination thereof. In some embodiments, the devices include integrated circuit devices, for example. In some embodiments, the devices are, for example, transistors, capacitors, resistors, diodes, photodiodes, fuse devices, or other similar devices. That is to say, the wafer 50 is a wafer with devices formed in it.

The interconnect structure 14 is formed over the substrate 10 and the device layer 11. In some embodiments, the interconnect structure 14 includes a dielectric structure 12 and a plurality of metal features 13. The dielectric structure 12 includes silicon oxide, silicon oxynitride, silicon nitride, USG, low dielectric constant (low-k) materials or a combination thereof. In some embodiments, the low-k material may have a k value of less than about 2.5, and hence is sometimes referred to as an extreme low-k (ELK) dielectric material. In some embodiments, the low-k material includes a polymer based material, such as benzocyclobutene (BCB), FLARE®, or SILK®; or a silicon dioxide based material, such as hydrogen silsesquioxane (HSQ) or SiOF. The dielectric structure 12 may include a single layer or multiple layers. In an embodiment, the dielectric structure is a multilayer structure and includes ELK dielectric material and USG thereon.

The metal features 13 may be made of tungsten (W), copper (Cu), copper alloys, aluminum (Al), aluminum alloys, or a combination thereof. The metal features 13 are formed in the dielectric structure 12 and electrically connected with each other. In some embodiments, the metal features 13 include one or more layers of plugs and metal lines. The metal lines are extending along a direction parallel to the top surface of the substrate 10. The plugs include contact plugs and via plugs. The contact plugs electrically connect the metal lines to the devices formed in the device layer 11. The via plugs electrically connect the metal lines in different layers. In some embodiments, the number of the layers of the metal lines is 11, for example, but the disclosure is not limited thereto. A portion of the metal features 13, such as top metal feature TP (or referred as top metal line), is exposed by the dielectric structure 12. In some embodiments, the top metal feature TP includes fine-pitch metallization patterns. The pitch of the top metal feature TP ranges from 0.8 µm to 3 µm, or 0.5 µm to 5 µm, for example.

In some embodiments, one or more through-silicon vias (TSVs) 9 inserts into the substrate 10 to be electrically connected to the interconnect structure 14. In some embodiments, the TSV 9 includes a conductive via and a liner (not shown) surrounding the sidewalls and bottom surface of the conductive via. The conductive via may include copper, copper alloys, aluminum, aluminum alloys, Ta, TaN, Ti, TiN, CoW or combinations thereof. The liner may include dielectric material, such as silicon oxide. In some embodiments, the TSV 9 does not penetrate through the substrate 10 at the beginning, and the bottom surface of the TSV 9 is still covered by the substrate 10. In subsequent processes, the substrate 10 may be thinned by a grinding or planarization process, so as to expose the bottom surface of the TSV 9, and the TSV 9 may be connected to other components.

The passivation layer 15 is formed over the interconnect structure 14. In some embodiments, the passivation layer 15 is also referred as a dielectric layer. The passivation layer 15 may be a single layer structure or a multilayer structure. The passivation layer 15 includes an insulating material such as silicon oxide, silicon nitride, polymer, or a combination thereof. The polymer is, for instance, polybenzoxazole (PBO), polyimide, benzocyclobutene (BCB), a combination thereof, or the like.

In some embodiments, the pads 16 are formed on the passivation layer 15 and penetrate through the passivation layer 15 to be electrically connected to the metal feature 13 of the interconnect structure 14, and provide an external connection of the devices in the device layer 11. The material of the pads 16 may include metal or metal alloy, such as aluminum, copper, nickel, or alloys thereof.

Still referring to FIG. 2A, in some embodiments, a bonding structure 19 is formed on the pads 16 and the passivation layer 15. The bonding structure 19 includes a dielectric structure 17 and a plurality of conductive structures 18. In some embodiments, the dielectric structure 17 covers the sidewalls and top surfaces of the pads 16, and the top surface of the passivation layer 15. The conductive structure 18 penetrates through the dielectric structure 17 to be electrically connected to the pads 16, and further electrically connected to the interconnect structure 14 through the pads 16. In some embodiments, the top surface of the conductive structure 18 is exposed by the dielectric structure 17, and the conductive structure 18 is also referred as a bonding pad.

The dielectric structure 17 includes oxide such as silicon oxide, nitride such as silicon nitride, oxynitride such as silicon oxynitride, undoped silicate glass (USG), tetraethyl orthosilicate (TEOS), or a combination thereof. The material of the dielectric structure 17 may be the same as or different from the material of the passivation layer 15. The dielectric structure 17 may be formed by a suitable process such as spin coating, chemical vapor deposition (CVD) or the like.

The dielectric structure 17 may include a single layer or multiple layers. In some embodiments, the dielectric structure 17 includes a first dielectric layer 17a and a second dielectric layer 17b on the first dielectric layer 17a. In some embodiments, the first dielectric layer 17a and the second dielectric layer 17b include different materials. The first dielectric layer 17a includes, for example, oxide such as silicon oxide, USG, TEOS or a combination thereof. The second dielectric layer 17b includes, for example, oxide such as silicon oxide, USG or a combination thereof. In some embodiments, the thickness of the first dielectric layer 17a is larger than the thickness of the second dielectric layer 17b.

In some embodiments, the conductive structure 18 may be formed of aluminum, copper, nickel, gold, silver, tungsten, or a combination thereof and formed by electro-chemical plating process, CVD, PVD or the like. In some embodiments, the conductive structure 18 is a via formed in the dielectric structure 17. The conductive structure 18 may be a single layer structure or a multi-layer structure. In some embodiments, the conductive structure 18 may be formed by the following process: openings (or referred as via holes) are formed in the dielectric structure 17 to expose portions of the top surfaces of the pads 16, a conductive material layer in formed on the dielectric structure 17 and fills into the openings, thereafter, a planarization process such as a chemical mechanical polishing (CMP) process is performed to remove the conductive material layer on the top surface of the dielectric structure 17, and remain the conductive structures 18. In some embodiments, the top surface of the conductive structure 18 is substantially coplanar with the top surface of the dielectric structure 17.

In some embodiments, the conductive structure 18 includes a first via 18a and a second via 18b electrically connected to each other. The materials of the first via 18a and the second via 18b may be the same or different. The first via 18a and the second via 18b may be formed by a dual damascene process, for example. The cross-section shapes of the first via 18a and the second via 18b may respectively be square, rectangle, trapezoid, or the like. The sidewalls of the first via 18a and the second via 18b may respectively be straight or inclined. The cross-section shape of the conductive structure 18 may be T-shaped or the like.

In some embodiments, the first via 18a is formed in the first dielectric layer 17a and landing on the pad 16. The top surface of the first via 18a is substantially coplanar with the top surface of the first dielectric layer 17a. The second via 18b is formed in the second dielectric layer 17b and on the first via 18a. The top surface of the second via 18b is substantially coplanar with the top surface of the second dielectric layer 17b. In some embodiments, the height H1 of the first via 18a is higher than the height H2 of the second via 18b, and the diameter (or top diameter) DA1 of the first via 18a is less than the diameter (bottom diameter or top diameter) DA2 of the second via 18b. In some embodiments, the height H1 of the first via 18a ranges from 1 μm to 4 μm, for example. The diameter DA1 of the first via 18a ranges from 1 μm to 3 μm, for example. The height H2 of the second via 18b ranges from 0.5 μm to 1 μm, for example. The diameter DA2 of the second via 18b ranges from 2 μm to 5 μm, for example. In some embodiments, the pitch P1 of the second via 18b is in a range of 5 μm to 20 μm. The term "pitch" described herein refers to a width of the feature (e.g., line) plus the distance to the next immediately adjacent feature. In other words, the pitch P1 refers to the diameter DA2 of the second via 18b plus the distance between the adjacent two second vias 18b.

In the embodiment described in FIG. 2A, the conductive structure 18 is landing on the pads 16, but the disclosure is not limited thereto.

Figure 2B:
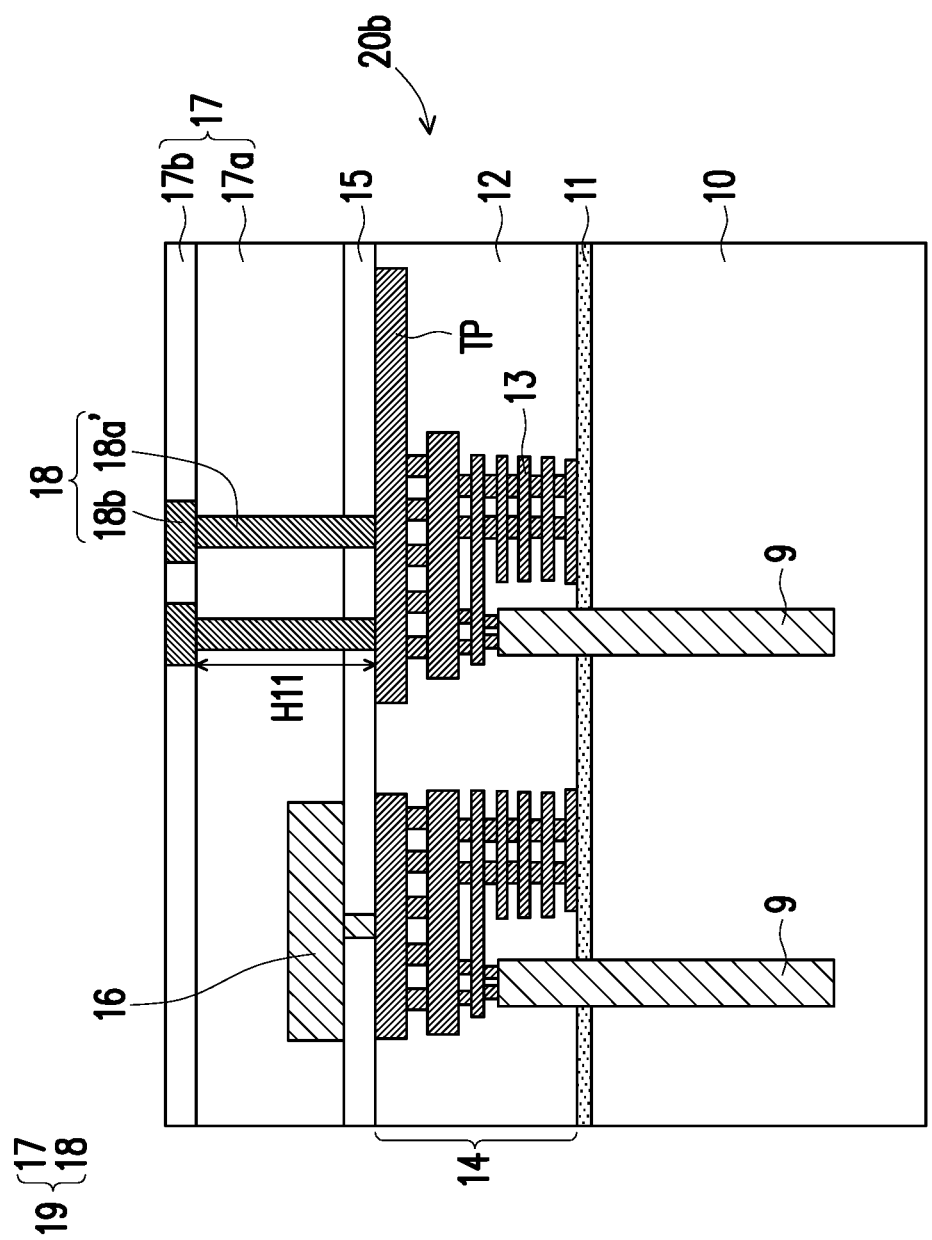

Referring to FIG. 2B, a die 20b of the wafer 50 is similar to the die 20a shown in FIG. 2A, except that the conductive structure 18 of the die 20b is landing on the top metal feature TP of the interconnect structure 14.

Referring to FIG. 2B, the conductive structure 18 includes a first via 18a' and a second via 18b on the first via 18a'. The first via 18a' is located at a side of the pad 16 and physically separated from the pad 16. The first via 18a' penetrates through the first dielectric layer 17a and the passivation layer 15 to be electrically connected to the metal feature 13 of the interconnect structure 14. In some embodiments, the first via 18a' is landing on the top metal feature TP, but the disclosure is not limited thereto. The first via 18a' may be landing on any layer of the metal feature 13. The height H11 of the first via 18a' ranges from 3 μm to 6 μm, for example. The other structure features of the die 20b are substantially the same as those of the die 20a, and are not described again.

Figure 2C:
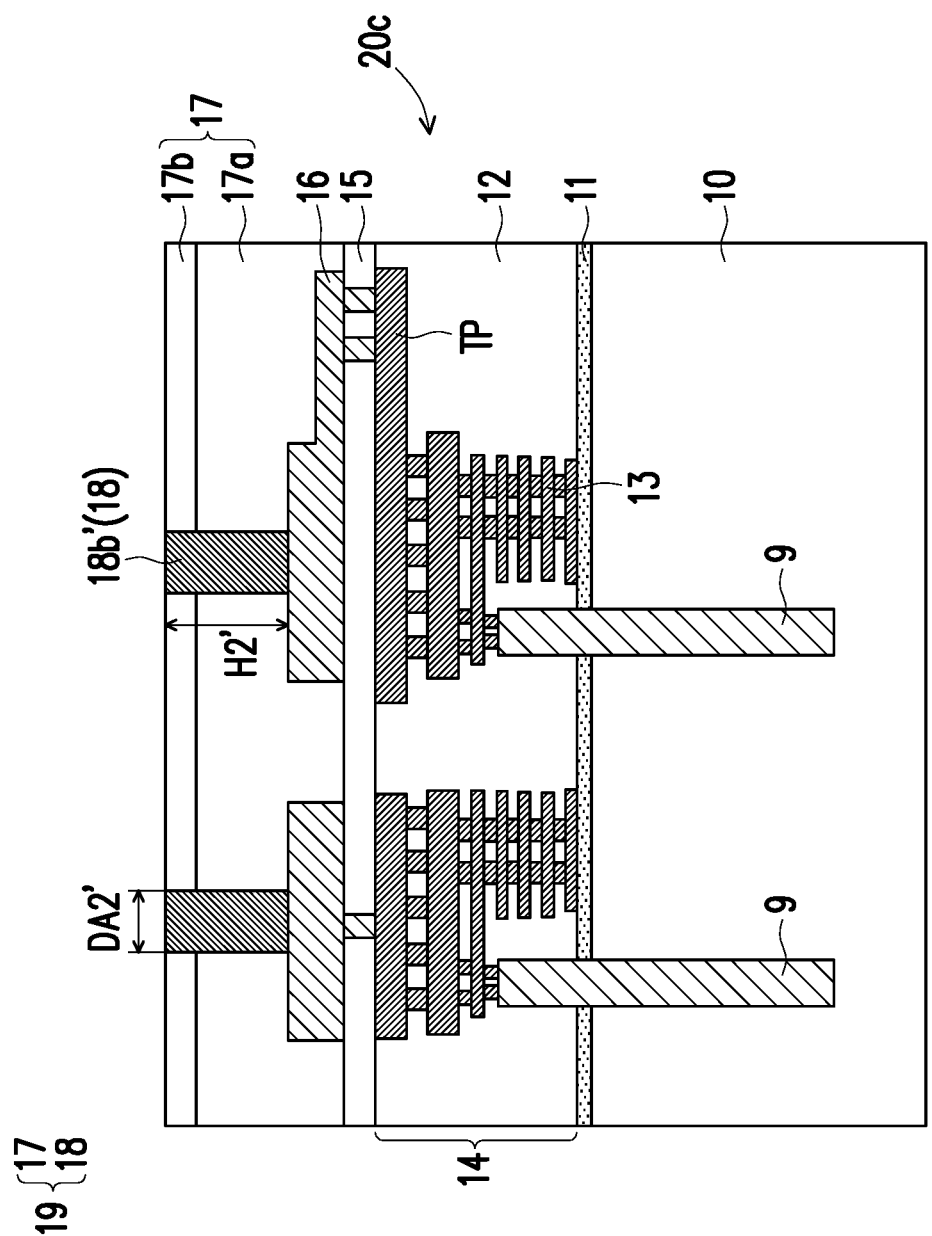

In alternative embodiments, the conductive structure 18 may include a large deep via instead of two vias. Referring to FIG. 2C, a die 20c of the wafer 50 is similar to the die 20a, except that the conductive structure 18 includes a plurality of vias 18b' directly landing on the pads 16 and does not include first vias 18a.

Referring to FIG. 2C, the conductive structure 18 may be formed by a single-damascene process. The cross-section shape of the conductive structure 18 (that is, the via 18b') is square, rectangle, trapezoid, or the like. The sidewalls of the conductive structure 18 may be straight or inclined. In some embodiments, the conductive structure 18 has a uniform diameter from the top surface to the bottom surface thereof. In some other embodiments, the conductive structure 18 has a diameter decreasing gradually from the top surface to the bottom surface thereof. That is to say, the area or the diameter of the top surface of the conductive structure 18 is equal to or larger than the area or the diameter of the bottom surface of the conductive structure 18. The via 18b' penetrates through the second dielectric layer 17b and the first dielectric layer 17a of the dielectric structure 17, so as to land on the pad 16 and electrically connect to the interconnect structure 14 through the pad 16. The height H2' of the via 18b' ranges from 2 μm to 5 μm, for example. The diameter DA2' of the via 18b' is substantially the same as the diameter DA2 of the second via 18b described in FIG. 2A. In this embodiment, the dielectric structure 17 may be a single-layer structure. The other structural features of the die 20c are substantially the same as those of die 20a or the die 20b, and are not described again.

Figure 2D:
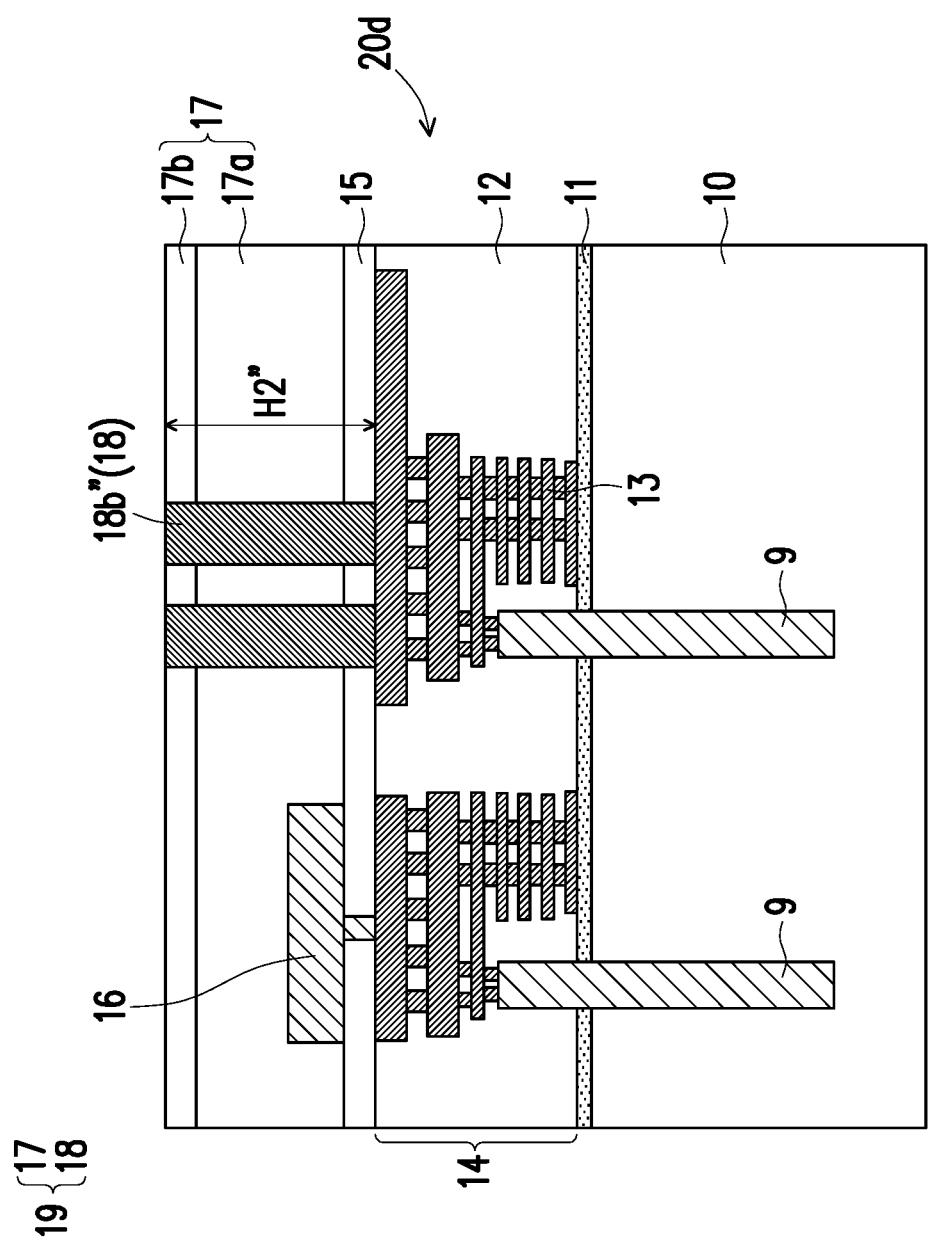

In alternative embodiments, the conductive structure 18 including a large deep via may directly land on the metal feature 13 of the interconnect structure 14. Referring to FIG. 2D, a die 20d of the wafer 50 is similar to the die 20b, except that the conductive structure 18 includes a plurality of vias 18b" landing on the metal features 13.

Referring to FIG. 2D, the conductive structure 18 includes a plurality of vias 18b". The via 18b" penetrates through the second dielectric layer 17b and the first dielectric layer 17a of the dielectric structure 17 and the passivation layer 15 to land on the metal feature 13. In some embodiments, the via 18b" is landing on the top metal feature TP of the interconnect structure 14. The height H2" of the via 18b" ranges from 4 μm to 7 μm, for example. The other structural features of the die 20d are substantially the same as those of die 20c shown in FIG. 2C, and are not described again.

Referring back to FIG. 1A, the dies 20 of the wafer 50 shown in FIG. 1A may include the structure similar to any one of the die 20a, 20b, 20c and 20d shown in FIGS. 2A to 2D. For the sake of brevity, the structure of the die 20 is not specifically shown, and the bonding structure 19 is briefly shown in FIG. 1A.

Referring to FIG. 1B, a plurality of bonding dies 30 are provided. In some embodiments, the bonding dies 30 are known good dies (KGDs) cutting from a wafer by a die saw process, or a plasma dicing process. The bonding dies 30 may be the same type of dies or different types of dies. The thickness T1 of the die 30 ranges from 50 μm to 200 μm.

In some embodiments, the bonding die 30 includes a substrate 23, a dielectric structure 24, a metal interconnection 25 and a bonding structure 29. The substrate 23 may include materials the same as or different from those of the substrate 10 of the wafer 50 (FIG. 1A). In some embodiments, the substrate 23 may be a semiconductor substrate, a polymer substrate, a dielectric substrate, a ceramic substrate, or a combination thereof. The semiconductor substrate is, for example, a doped silicon substrate, an undoped silicon substrate or a semiconductor-on-insulator (SOI) substrate. The doped silicon substrate may be P-type doped, N-type doped, or a combination thereof.

The dielectric structure 24 is formed over the substrate 23. The dielectric structure 24 may be a single-layer structure or a multi-layer structure. The material of the dielectric structure may be the same as or different from the material of the dielectric structure 12, which is not described again.

The metal interconnection 25 is formed over the substrate 23 and in the dielectric structure 24. The metal interconnection 25 may be formed using single damascene and/or dual-damascene process. The structural feature and the material of the metal interconnection 25 are similar to, the same as or different from those of the metal features 13 shown in FIG. 2A. In some embodiments, the metal interconnection 25 includes a plurality of plugs 25b and metal lines 25a connected to each other. The metal lines are extending along a direction parallel to a top surface of the substrate 23. The plugs 25b are located between the metal lines 25a and extending along a direction perpendicular to the top surface of the substrate 23. The metal lines 25a in different layers are connected to each other through the plugs 25b. In some embodiments, the number of the layers of the metal lines 25a in the metal interconnection 25 may be less than, equal to or more than the number of the layers of the metal lines in the metal feature 13 (FIGS. 2A to 2D). In some embodiments, the number of the layers of the metal lines 25a ranges from 1 to 3, such as 3, but the disclosure is not limited thereto. In some embodiments, the pitch of the metal line 25a of the metal interconnection 25 may be the same as or different from the pitch of the metal lines of the metal feature 13 (such as the metal line on which the conductive structure 18 is landing) (FIG. 2A). In some embodiments, the pitch of the metal line 25a of the metal interconnection 25 may be the same as or different from the pitch of the top metal feature TP (FIG. 2A). In some embodiments, the ratio of the pitch of the metal line 25a to the pitch of the top metal feature TP ranges from 0.5 to 31, such as 30. The distance E2 between the metal lines 25a of the metal interconnection 25 may be less than, equal to, or slightly larger than the distance E1 between the metal lines of the metal feature 13 (such as, the distance between the top metal feature TP and the underlying metal line thereof adjacent thereto).

The bonding structure 29 includes a dielectric layer 27 and a plurality of bonding pads 28 formed in the dielectric layer 27. The bonding pads 28 are formed on and electrically connected to the metal interconnection 25 and serve as external connection of the bonding die 30. The dielectric layer 27 and the bonding pad 28 may respectively include materials the same as or different from those of the dielectric structure 17 and the conductive structure 18 shown in FIG. 2A. In some embodiments, the dielectric layer 27 may include oxide such as silicon oxide, nitride such as silicon nitride, oxynitride such as silicon oxynitride, undoped silicate glass (USG), tetraethyl orthosilicate (TEOS), or a combination thereof. The bonding pad 28 includes aluminum, copper, nickel, gold, silver, tungsten, or a combination thereof. The forming method of the bonding structure 29 is similar to and may be the same as or different from that of the bonding structure 19.

The diameter DA10 and the pitch P10 of the bonding pad 28 may be the same as or different from those of the pad 18 of the die 20 (FIG. 1A). In some embodiments, the diameter DA10 (or top diameter) of the bonding pad 18 ranges from 0.4 μm to 20 μm, the pitch P10 of the bonding pad 18 ranges from 0.8 μm to 40 μm.

In some embodiments, the bonding die 30 is free from active or passive devices and is just used for connecting the dies 20 in the wafer 50 in subsequent processes. The substrate 23 is, for example, a bulk substrate. The metal interconnection 25 is located on the bulk substrate 23, and no device is formed between the metal interconnection 25 and the bulk substrate 23. However, the disclosure is not limited thereto. In some other embodiments, active or passive devices, such as transistors, diodes, capacitors, resistors, etc., may be formed in and/or on the substrate 23 and may be interconnected by the metal interconnection 25 to form an integrated circuit.

In some embodiments, the bonding die 30 may include TSVs (not shown) in the substrate 23 and electrically connected to the metal interconnection 25, the TSV may be surrounded by the substrate 23. The structure feature of the TSV in the bonding die 30 may be similar to the TSV 9 of the die 20 shown in FIG. 2A.

Figure 1C:
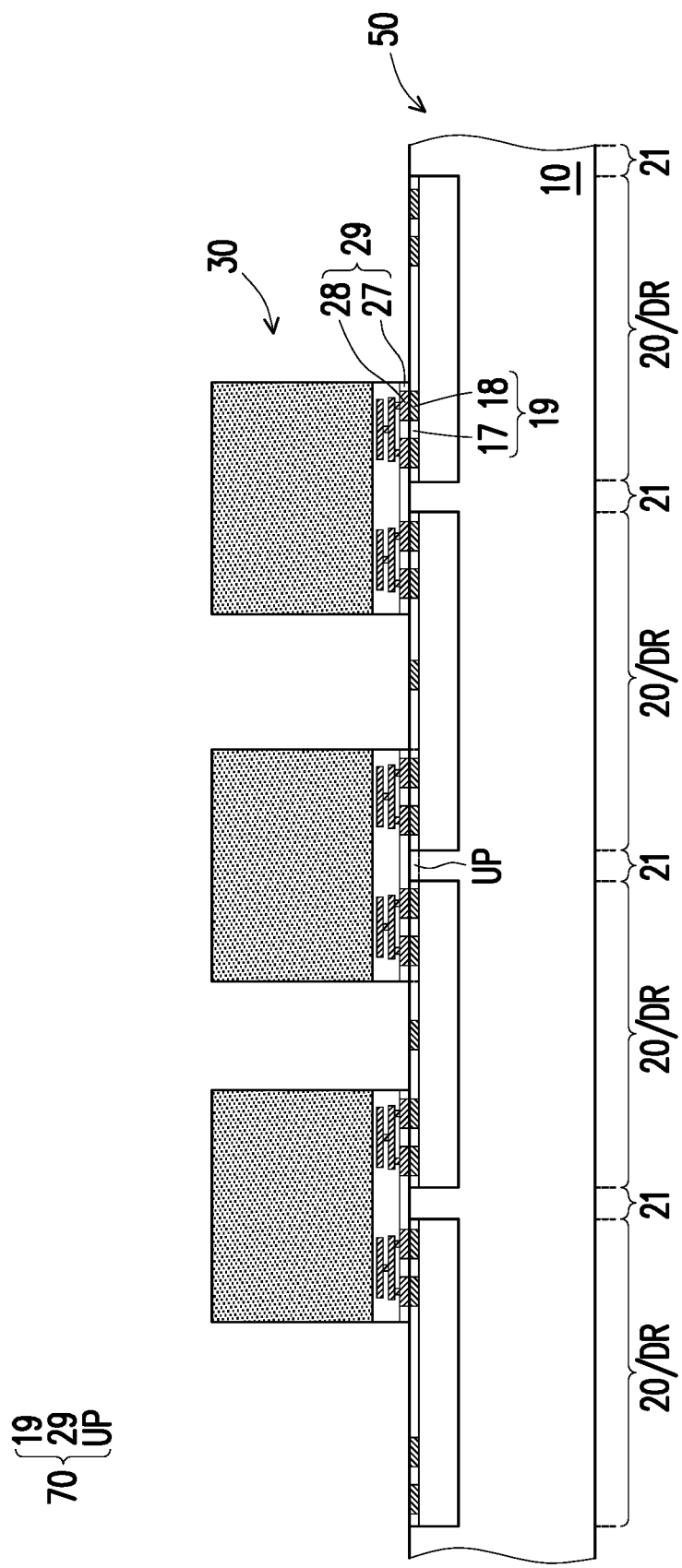

Referring to FIG. 1C, the bonding dies 30 are turned over to face the wafer 50. That is, the bonding dies 30 and the wafer 50 are configured as face to face. In some embodiments, one bonding die 30 is aligned with two adjacent dies 20 of the wafer 50. The bonding structure 29 of the bonding die 30 is aligned with the bonding structures 19 of the adjacent two dies 20. In detail, the bonding pads 28 of the bonding structure 29 are aligned with the pads 18 of the bonding structures 19. The dielectric layer 27 of the bonding structure 29 is aligned with the dielectric structure 17 of the bonding structures 19.

The bonding dies 30 are bonded to the wafer 50 through a suitable bonding process, such as a hybrid bonding process, a fusion bonding process, or a combination thereof. In some embodiments in which the bonding process includes a hybrid bonding process, the hybrid bonding involves at least two types of bonding, including metal-to-metal bonding and non-metal-to-non-metal bonding such as dielectric-to-dielectric bonding. That is to say, the bonding pads 28 and the pads 18 are bonded by metal-to-metal bonding, the dielectric layer 27 and the dielectric structure 17 are bonded by dielectric-to-dielectric bonding.

In other word, the bonding die 30 and the wafer 50 are bonded to each other by a hybrid bonding structure 70. The hybrid bonding structure 70 includes portions of the bonding structures 19 of two adjacent dies 20 and the bonding structure 29 of the bonding die 30. In some embodiments, the bonding die 30 is also bonded to the scribe region 21 between the dies 20, and the hybrid bonding structure 70 further includes an upper portion UP of the scribe region 21. In some embodiments, the upper portion UP of the scribe region 21 includes dielectric materials or/and conductive materials.

In some embodiments, the bonding process may be performed as below: first, to avoid the occurrence of the unbonded areas (i.e. interface bubbles), the to-be-bonded surfaces of the bonding dies 30 and the wafer 50 (that is, the surfaces of the bonding structure 29 and the bonding structure 19 and the scribe region 21) are processed to be sufficiently clean and smooth. Then, the bonding dies 30 and the dies 20 of the wafer 50 are aligned and placed in physical contact at room temperature with slight pressure to initiate a bonding operation. Thereafter, a thermal treatment such as an annealing process at elevated temperatures is performed to strengthen the chemical bonds between the to-be-bonded surfaces of the dies 30 and the wafer 50 and to transform the chemical bonds into covalent bonds.

Still referring to FIG. 1C, the bonding dies 30 are electrically bonded to the wafer 50, one of the bonding dies 30 is electrically bonded to two of the dies 20. The bonding die 30 is located on two adjacent dies 20 and across the scribe region 21 between the two dies 20. That is to say, the bonding die 30 covers portions of top surfaces of the two adjacent dies 20 and the top surface of the scribe region 21 between the two adjacent dies 20. The adjacent two dies 20 of the wafer 50 are electrically connected through the bonding die 30.

In some embodiments, after the bonding dies 30 are bonded to the wafer 50, a thinning process is performed on the bonding dies 30 to thin the substrates 23. The thinning process includes grinding process, CMP process, or a combination thereof.

Figure 1D:
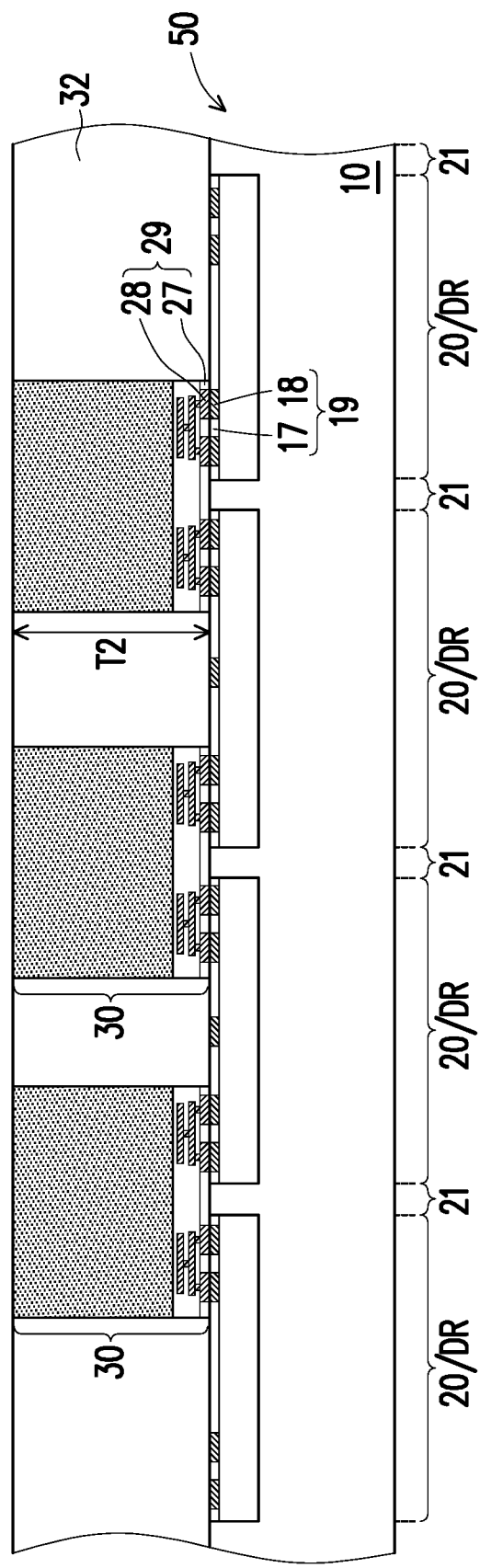

Referring to FIG. 1D, a gap fill structure 32 is formed on the wafer 50 and at the sides of the bonding dies 30, so as to cover the top surface of the wafer 50 and the sidewalls of the bonding dies 30. The material of the gap fill structure 32 may include oxide such as silicon oxide, nitride such as silicon nitride, oxynitride such as silicon oxynitride, a molding compound, a molding underfill, a resin such as epoxy, a combination thereof, or the like. In some embodiments, the top surface of the gap fill structure 32 and the top surfaces of the bonding dies 30 are substantially coplanar with each other.

In some embodiments, the gap fill structure 32 may be formed by the following process: a gap fill material is formed on the wafer 50 and the bonding dies 30 by, for example, a deposition process such as CVD, a molding process, or a molding underfilling (MUF) process. The gap fill material cover the top surface of the wafer 50, the top surfaces and the sidewalls of the bonding dies 30. Thereafter, a planarization process such as a CMP process is performed to remove a portion of the gap fill structure 32 or/and portions of the substrates 23 of the bonding dies 30. In some embodiments, the bonding dies 30 are further thinned during the planarization process, and a thickness T2 of the thinned bonding die 30 ranges from 10 μm to 60 μm, such as 20 μm.

Figure 1E:
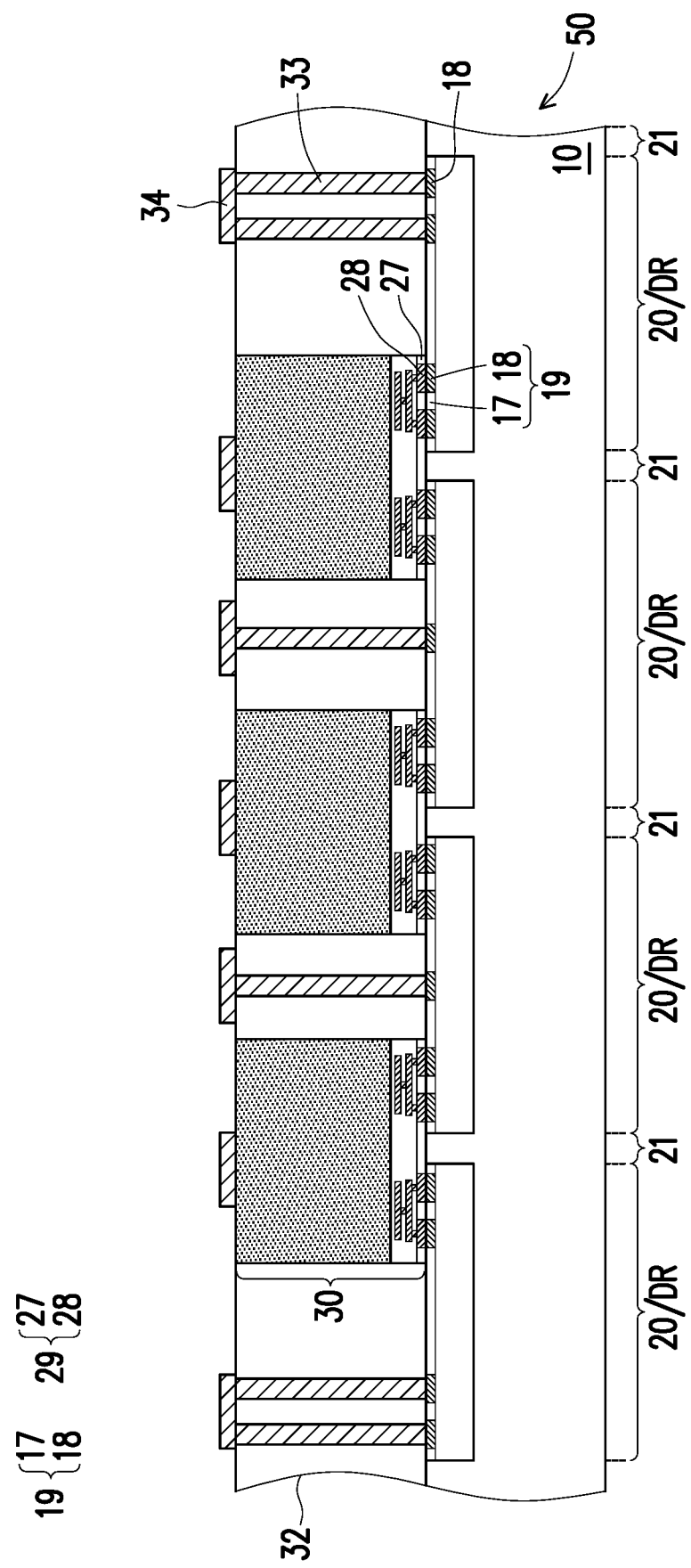

Referring to FIG. 1E, a plurality of through dielectric vias (TDVs) 33 are formed in the gap fill structure 32 and on the pads 18 of the dies 20. The TDV 33 penetrates through the gap fill structure 32 to be in electrical contact with the pads 18 of the dies 20. The TDVs 33 include conductive materials such as copper, nickel, solder, alloys thereof, or the like, or a combination thereof. The TDVs 33 are formed by, physical vapor deposition (PVD), electroplating, or a combination thereof, for example.

In some embodiments, the TDV 33 includes a seed layer and a conductive layer formed on the seed layer. The seed layer is, for example, a titanium or/and copper composited layer. The conductive layer is, for example, a copper layer.

In some embodiments, the TDVs 33 may be formed after or before the gap fill structure 32 is formed. In some embodiments in which the TDVs 33 are formed after the gap fill structure 32 is formed, the TDVs 33 may be formed by the following processes: the gap fill structure 32 is patterned by photolithography and etching process to form a plurality of via holes. The via holes penetrate through the gap fill structure 32 to expose portions of top surfaces of the pads 18. A seed material layer is formed on the substrate 10 by a suitable technique such as a sputtering process, the seed material layer fills into the via holes to cover the sidewalls and bottom surfaces of the via holes, and may further cover the top surfaces of the gap fill structure 32 and the bonding dies 30. A conductive material layer is formed on the seed material layer by an electroplating process. The conductive material layer fills into the via holes and may further protrude from the top surface of the gap fill structure 32. Thereafter, a planarization process is performed to remove the conductive material layer and the seed material layer on the gap fill structure 32 or/and on the bonding dies 30, and remain the conductive layer and the seed layer in the via holes.

Still referring to FIG. 1E, a redistribution layer (RDL) 34 is formed on the TDVs 33 and the gap fill structure 32 or/and on the back sides (the side opposite to the front side and further from the bonding pad 28 than the front side) of the bonding dies 30. The RDL 34 is electrically connected to the pads 18 of the dies 20 through the TDVs 33. The dies 20 are electrically connected to each other through the bonding dies 30, the TDVs 33 and the RDL 34.

In some embodiments, the RDL 34 includes conductive materials. The conductive material includes metal such as copper, nickel, titanium, a combination thereof or the like, and is formed by an electroplating process. In some embodiments, the RDL 34 includes a seed layer and a conductive layer formed on the seed layer. The seed layer may be a metal seed layer such as a copper seed layer. In some embodiments, the seed layer includes a first metal layer such as a titanium layer and a second metal layer such as a copper layer over the first metal layer. The conductive layer may be copper or other suitable metals.

In some embodiments, the RDL 34 may be formed by the following process: A seed layer is formed on the wafer 50, by a sputtering process, for example. The seed layer covers the top surfaces of the gap fill structure 32, the TDVs 33 and the bonding dies 30. A patterned mask such as a patterned photoresist is then formed on the top surface of the gap fill structure 32 and the bonding dies 30. The patterned mask includes openings exposing a portion of seed layer on the top surfaces of the TDVs 33, the gap fill structure 32 or/and on the bonding dies 30. A conductive layer is formed on the seed layer exposed by the patterned mask by an electroplating process, for example. Thereafter, the patterned mask is stripped and the seed layer not covered by the conductive layer is removed by an etching process. The conductive layer and the underlying seed layer form the RDL 34.

Figure 1F:
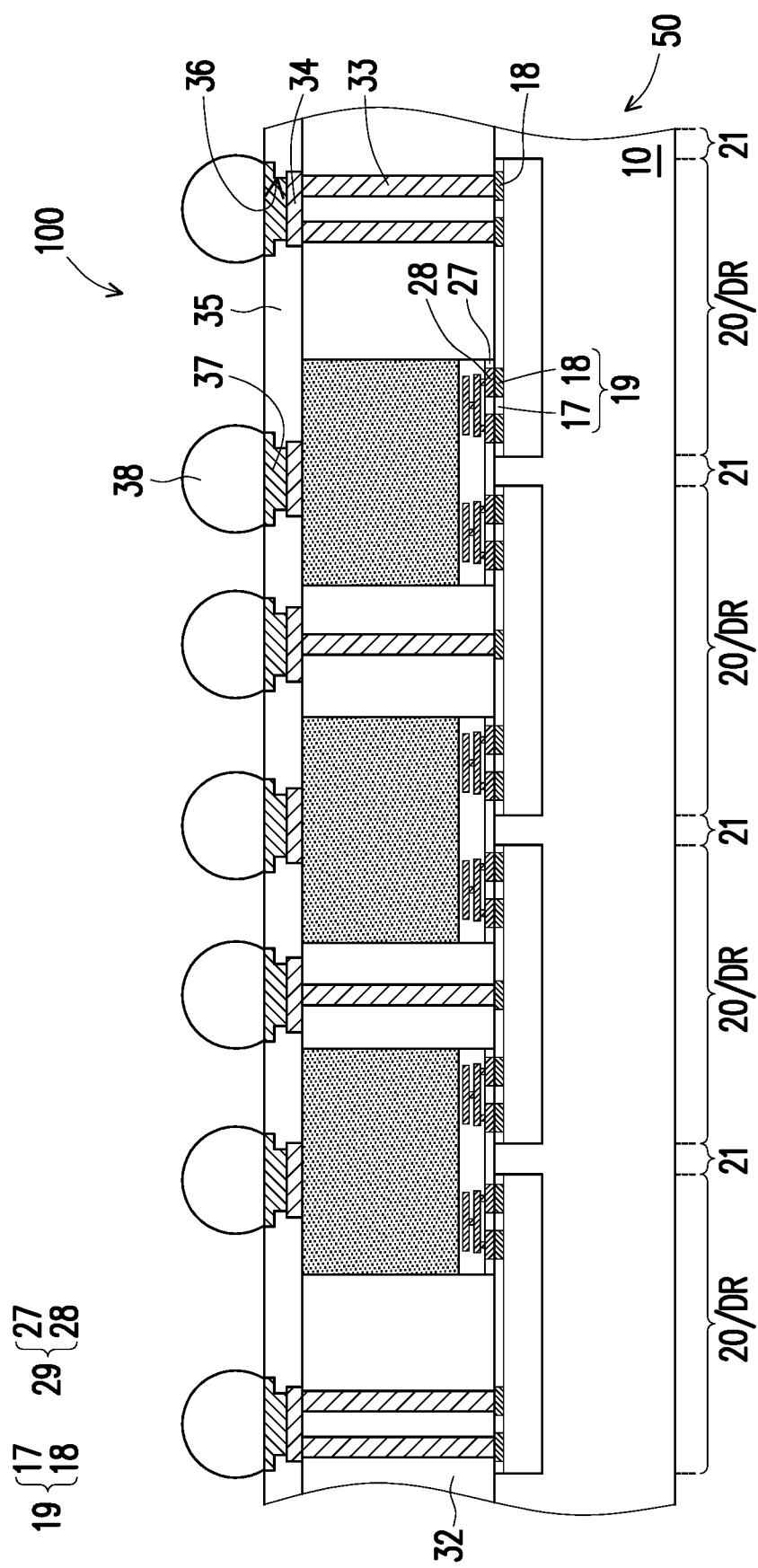

Referring to FIG. 1F, a dielectric layer 35 is formed over the wafer 50. The dielectric layer 35 may include silicon oxide, silicon nitride, silicon oxynitride, USG, TEOS, a polymer, or a combination thereof. The polymer includes a photo-sensitive material such as polybenzoxazole (PBO), polyimide (PI), benzocyclobutene (BCB), a combination thereof or the like. The forming method of the dielectric layer 35 include suitable fabrication techniques such as spin coating, chemical vapor deposition (CVD), plasma-enhanced chemical vapor deposition (PECVD), lamination or the like.

In some embodiments, the dielectric layer 35 covers the top surface of the gap fill structure 32, the top surface of the bonding dies 30, the top surface of the RDL 34 and the sidewalls of the RDL 34. The dielectric layer 35 may include a single layer or multi layers.

Thereafter, a plurality of openings 36 are formed in the dielectric layer 35 to expose portions of the top surface of the RDL 34. The forming method of the openings 36 may include photolithography and etching processes, a laser drilling process, or a combination thereof.

A plurality of conductive pads 37 are formed in the openings 36 and on the RDL 34. The conductive pads 37 may be formed of metal or metal alloy, such as aluminum, copper, nickel, or alloys thereof, and may be formed by a dual-damascene process, PVD, electroplating, or a combination thereof. The conductive pad 37 penetrates through the dielectric layer 35 to be in electrical contact with the top surface of the RDL 34. In some embodiments, the top surfaces of the conductive pads 37 are substantially coplanar with the top surface of the dielectric layer 35, but the disclosure is not limited thereto. In some other embodiments, the conductive pad 37 protrudes from the top surface the dielectric layer 35.

Thereafter, a plurality of conductive terminals 38 are formed on and electrically connected to the conductive pad 37. The conductive terminals 38 may be micro bumps, conductive pillars, solder balls, controlled collapse chip connection (C4) bumps, or a combination thereof. In some embodiments, the material of the conductive terminals 38 includes copper, aluminum, lead-free alloys (e.g., gold, tin, silver, aluminum, or copper alloys) or lead alloys (e.g., lead-tin alloys). The conductive terminals 38 may be formed by a suitable process such as evaporation, plating, ball dropping, screen printing and reflow process, a ball mounting process or a C4 process.

The conductive terminals 38 are electrically connected to the dies 20 through the conductive pads 37, the RDL 34, the TDVs 33 and the bonding dies 30.

In some embodiments, thereafter, a die saw process or a plasma dicing process is performed on the scribe region 21 of the wafer 50 to separate the dies 20 which are not electrically connected to each other, and a package structure (3DIC structure) 100 is formed. In some embodiments, subsequent processes such as packaging process may be further performed on the 3DIC structure 100, the 3DIC structure 100 may be further connected to other components (such as dies, packages) through the TSVs 9 (FIG. 2A) or the conductive terminals 38.

Referring to FIG. 1F, the 3DIC structure 100 includes the substrate 10, the dies 20, the bonding dies 30, the gap fill structure 32, the TDVs 33, the RDL 34 and the conductive terminals 38. In some embodiments, one bonding die 30 is electrically connected two or more dies 20, the number of the bonding dies 30 is less than the number of the dies 20, but the disclosure is not limited thereto. The bonding die 30 covers the top surfaces of at least two adjacent dies 20 and a portion of the top surface of the scribe region 21 between the dies 20. In some embodiments, the 3DIC structure 100 includes four dies 20 and three bonding dies 30, but the disclosure is not limited thereto. The 3DIC structure 100 includes at least two dies 20 and at least one bonding die 30, and the number of the dies 20 and the bonding dies 30 are not limited to that is shown in FIG. 1F.

The dies 20 of the 3DIC structure 100 include the same substrate 10. In other words, the substrate 10 of the dies 20 is a continuous substrate. The dies 20 are spaced from each other by the scribe region 21, and are electrically connected to each other through the bonding dies 30, the TDVs 33 and the RDL 34. The top surface of the die 20 is covered by and in contact with the bonding dies 30, the TDVs 33 and the gap fill structure 32. In some embodiments, the die 20 may further be bonded to other die besides the bonding die 30. The other die may be located between the TDV 33 and the bonding die 30. In the embodiments shown in FIG. 1F, each die 20 has the TDV 33 formed thereon, but the disclosure is not limited thereto. The number of the TDVs 33 may be adjusted according the design of product. In some other embodiments, some of the dies 20 have TDVs 33 formed thereon, and some other dies 20 do not have TDVs 33 formed thereon.

The scribe region 21 is located between the dies 20, and the upper portion UP of the scribe region 21 is covered by and bonded to the bonding die 30. The structure of the scribe region 21 is described as below.

Figure 4B:
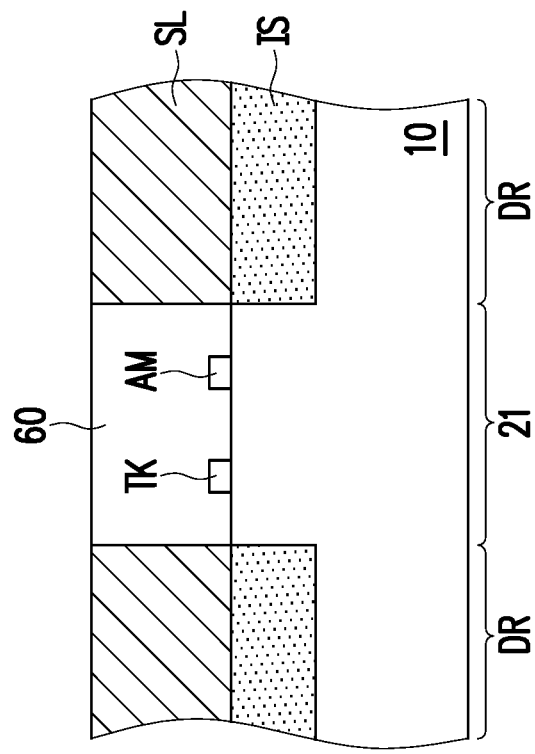
FIG. 4B is a cross-sectional view along a line A-A' of FIG. 4A according to some embodiments of the disclosure.
Figure 4A:
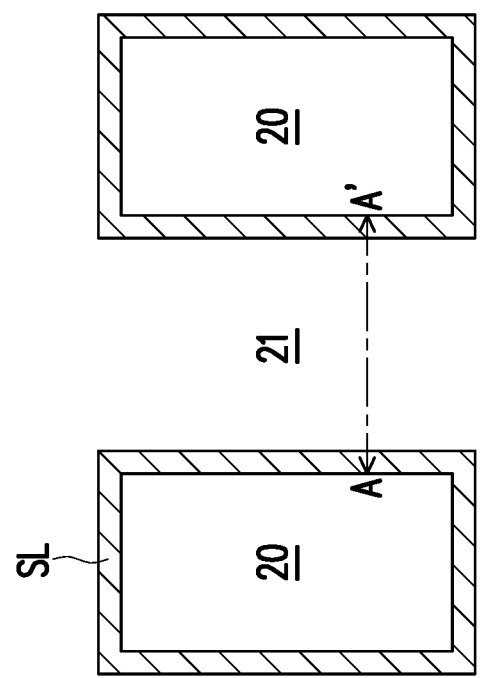
FIG. 4A is a top view of two dies and a scribe region of a 3DIC structure according to some embodiments of the disclosure.

FIG. 4A is a top view of the two dies 20 with a scribe region 21 therebetween of the 3DIC structure 100 according to some embodiments of the disclosure. FIG. 4B is a cross-sectional view along a line A-A' of FIG. 4A.

Referring to FIG. 1F, FIG. 4A and FIG. 4B, in some embodiments, the die 20 includes a seal ring SL on the edge of the die 20 and surrounding the inner portion of the die 20. The seal ring SL is located over the substrate 10 in the die region DR. In some embodiments, the seal ring SL includes a plurality of conductive lines and plugs connected to each other, and may be formed simultaneously with the metal feature 13 of the interconnect structure 14 of the die 20 (FIG. 2A), the seal ring SL is floated and electrically isolated from the inner portion of the die 20. In some embodiments, the seal ring SL may be located on an isolation structure IS in the substrate 10 in the die region DR, but the disclosure is not limited thereto. In some embodiments, the scribe region 21 may also include an isolation structure or a doped region formed in the substrate 10 thereof. The scribe region 21 is located between the seal rings SL of the dies 20, and separates from the inner portion of the die 20 by the seal ring SL or/and the isolation structure IS or/and the doped region. In some embodiments, the scribe region 21 includes the substrate 10 and dielectric materials 60 on the substrate 10, wherein the substrate 10 may include an isolation therein. In some embodiments, the scribe region 21 may include test keys TK or align marks AM formed on the substrate 10 and in the dielectric materials 60. The test keys TK and the align mark AM may include conductive materials. The top surfaces of the test key TK or the align mark AM may be covered by the dielectric material 60 or at a same level as the top surface of the dielectric material 60.

FIGS. 3A to 3D are top views of a 3DIC structure formed from a wafer according to some embodiments of the disclosure. FIGS. 3A to 3D illustrate the 3DIC structure before the die saw process is performed on the wafer. For the sake of brevity, only the dies, the bonding dies and the scribe region are specifically shown in FIGS. 3A to 3D.

Figure 3A:
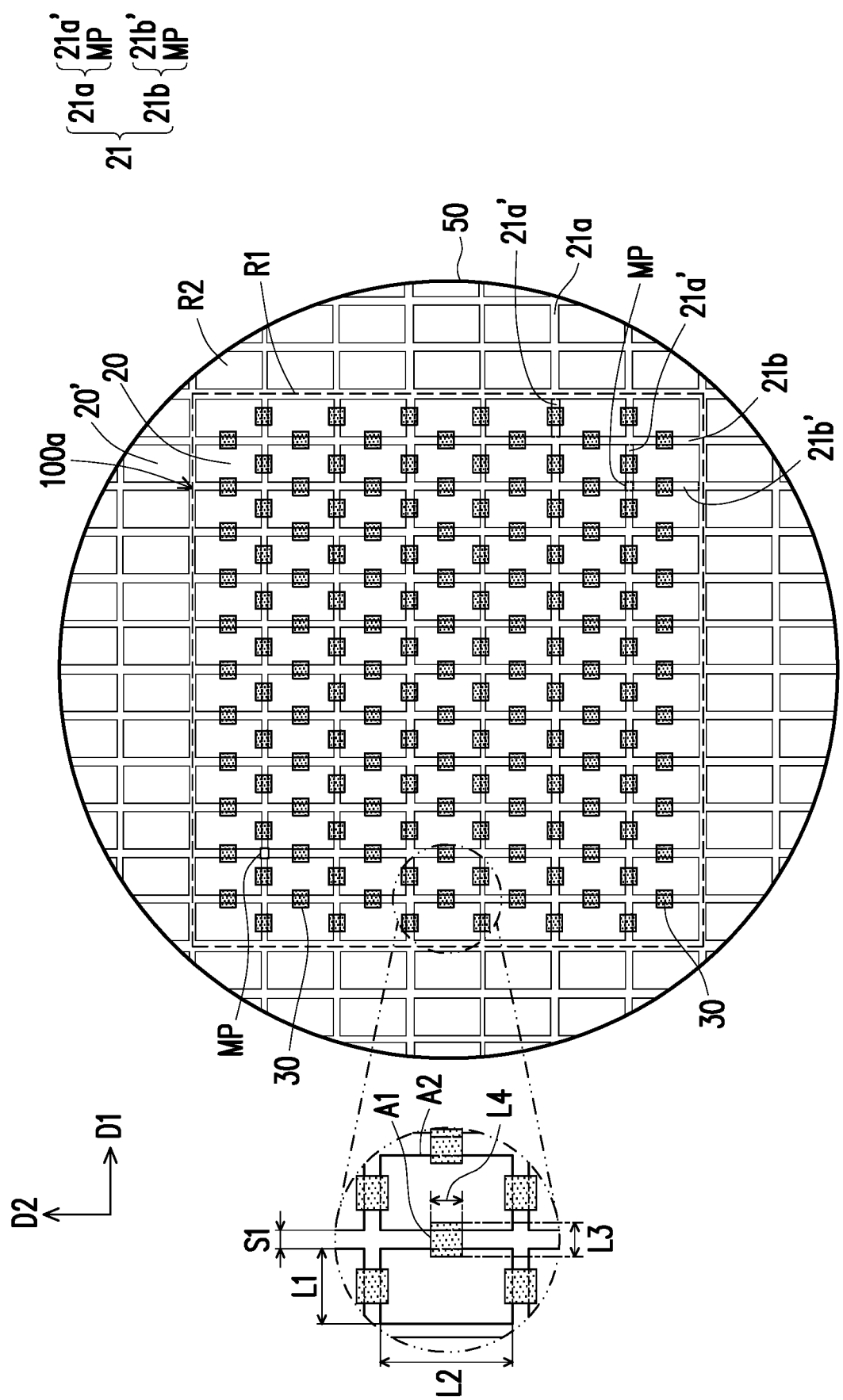
FIG. 3A to FIG. 3E are top views of a 3DIC structure according to some embodiments of the disclosure.

Referring to FIG. 3A, the wafer 50 includes a plurality of dies 20 and 20' spaced from each other by the scribe region 21. In some embodiments, the dies 20 and 20' are arranged in an array, but the disclosure is not limited thereto. The wafer 50 includes a first region R1 and a second region R2. The dies 20 are in the first region R1, and the dies 20' are in the second region R2. The first region R1 is a region in which the dies 20 are to be electrically connected to each other. In some embodiments, the first region R1 is a square or a rectangle region, but the disclosure is not limited thereto. The first region R1 may be any kind of shape. In an embodiments, an area of the first region R1 is ultra large, such as 215×215 mm. The second region R2 is the region of the wafer 50 other than the first region R1. In some embodiments, the dies 20' in the second region R2 are closer to the edge of the wafer 50 than the dies 20 in the first region R1.

In some embodiments, in the first region R1, the dies 20 are arranged in rows along a first direction D1, and arranged in columns along a second direction D2. The first direction D1 is perpendicular to the second direction D2, for example. In some embodiments, the dies 20 in different rows are substantially aligned with each other in the second direction D2, the dies 20 in different columns are substantially aligned with each other in the first direction D1. That is to say, the dies 20 in the first region R1 are configured as an array. However, the disclosure is not limited thereto. In some embodiments, the number of the dies 20 in each row arranged in the first direction D1 is the same as or different from the number of the dies in each column arranged in the second direction D2. In the embodiment shown in FIG. 3A, the dies 20 are arranged as a 12×7 array, but the disclosure is not limited thereto. The dies 20 may be arranged in any kind of array or any kind of arrangement according to the design of product.

The scribe region 21 is located between the dies 20 and 20' to separate the dies 20 and 20' from each other. In some embodiments, the scribe region 21 includes a plurality of scribe regions 21a and a plurality of scribe regions 21b between the dies 20. The scribe region 21a is located between the dies 20 in adjacent rows and extending from an end of the wafer 50 to an opposite end of the wafer 50 along the first direction D1. The scribe region 21a includes a plurality of first sections 21a' laterally located between two adjacent dies 20 arranged in the second direction D2. The scribe region 21b is located between the dies 20 in adjacent columns and extending from an end of the wafer 50 to an opposite end of the wafer 50 along the second direction D2. The scribe region 21b includes a plurality of second sections 21b' laterally located between the two dies arranged in the first direction D1. The scribe regions 21a and the scribe regions 21b are crossed with each other and meet at the cross points MP. The first sections 21a' and the second sections 21b' are connected to each other by the cross points MP, respectively. The cross point MP is surrounded by four dies 20 arranged in an 2×2 array and connected to first sections 21a' and the second sections 21b' between the dies 20 in the 2×2 array.

The dies 20 in the first region R1 are electrically connected to each other through the bonding dies 30. The dies 20 altogether serve as a large die (such as an ultra large die with an area of 215×215 mm). In some embodiments, one bonding die 30 is electrically bonded to two adjacent dies 20 and across the scribe region 21 between the two dies 20, but the disclosure is not limited thereto.

In some embodiments, the bonding dies 30 on the scribe regions 21a are aligned with each other in the first direction D1 and the second direction D2. The bonding dies 30 on the scribe regions 21b are aligned with each other in the first direction D1 and in the second direction D2. The bonding dies 30 in the scribe regions 21a and the bonding dies 30 in the scribe regions 21b are staggered with each other. In other words, in some embodiments, the bonding dies 30 are arranged in a plurality of rows along the first direction D1, and in a plurality of columns along the second direction D2. In some embodiments, the bonding dies 30 in adjacent two rows are stagger with each other in the second direction D2. Further, the bonding dies 30 in odd rows are aligned with each other in the second direction D2. The bonding dies 30 in even rows are aligned with each other in the second direction D2. The bonding dies 30 in adjacent two columns are staggered with each other in the first direction D1. Further, the bonding dies 30 in odd columns are aligned with each other in the first direction D1. The bonding dies 30 in even columns are aligned with each other in the first direction D1. In some embodiments, the bonding dies 30 have the same sizes, but the disclosure is not limited thereto. In some other embodiments, the bonding dies 30 may have different sizes.

In some embodiments, each of the first sections 21a' and each of the second sections 21b' have bonding dies formed thereon, and the cross points MP are not covered by the bonding die 30. However, the disclosure is not limited thereto. In some other embodiments, some of the first sections 21a' or some of the second sections 21b' may be not crossed or covered by the bonding die 30, as long as the dies 20 in the first region R1 is electrically connected to each other. In alternative embodiments, the cross point MP may be covered by the bonding die 30.

In some embodiments, in the first region R1 the number of the bonding dies 30 may be less than, equal to or larger than the number of the dies 20. In a same row or in a same column, the number of the bonding die 30 is less than the number of the dies 20.

Still referring to FIG. 3A, in some embodiments, the top view of the die 20 and the top view of the bonding die 30 may be square, rectangle or the like, respectively. The length L1 of the die 20 in the first direction D1 may be the same as or different from the length L2 of the die 20 in the second direction D2. The length L3 of the bonding die 30 may be the same as or different from the length L4 of the bonding die 30. The length L3 refers to a length of the bonding die 30 in a direction perpendicular to the extending direction of the underlying scribe region 21. The length L4 refers to a length of the bonding die 30 in a direction parallel to the extending direction of the underlying scribe region 21. The length L3 of the bonding die 30 is larger than the distance S1 (that is, the width of the scribe region 21) between the two dies 20, and may be less than the length L1/L2 of the die 20. In some embodiments, the area A1 of the top surface of the bonding die 30 is less than the area A2 of the top surface of the die 20. The ratio between the area A1 to the area A2 ranges from 1/2 to 1/50, for example.

Referring to FIG. 1F and FIG. 3A, in this embodiments, the die saw process is performed on the scribe regions 21 between the first region R1 and the second region R2, so as to form a 3DIC structure 100a including the dies 20 electrically connected to each other.

Figure 3B:
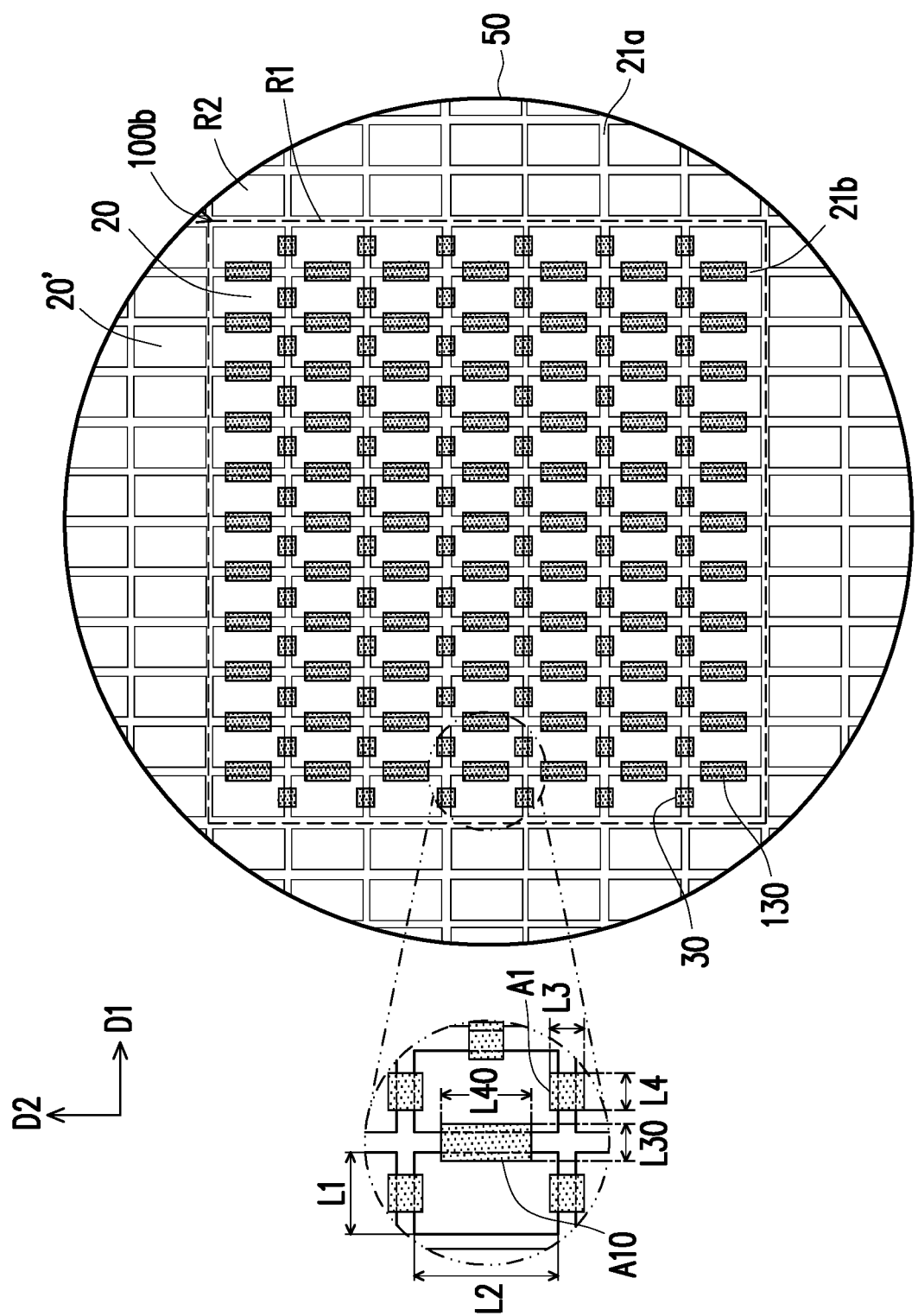

Referring to FIG. 3B, in some embodiments, the sizes of the bonding dies 30 on different sections of the scribe region 21 may be different from each other. For example, a 3DIC structure 100b includes a plurality of bonding dies 30 and a plurality of bonding dies 130. The bonding dies 30 are across the scribe regions 21a, and the bonding dies 130 are across the scribe regions 21b. In some embodiments, the size of the bonding die 30 is different from the size of the bonding die 130.

The bonding die 130 has a length L30 and a length 40. The length L30 is the length of the bonding die 130 in the direction D1 perpendicular to the extending direction D2 of the scribe region 21b. The length L40 is the length of the bonding die 130 in the direction D2 parallel to the extending direction D2 of the scribe region 21b. In some embodiments, the length L40 is larger than the length L30. The bonding die 30 has a length L3 and a length L4 substantially the same as those described in FIG. 3A. In some embodiments, the length L40 of the bonding die 130 is larger than the length L4 of the bonding die 30. The length L30 of the bonding die 130 may be substantially the same as or larger than the length L3 of the bonding die 30. The area A10 of the top surface of the bonding die 130 is larger than the area A1 of the top surface of the bonding die 30.

In some embodiments, the bonding dies 130 on the scribe regions 21b may have the same size or different sizes. The bonding dies 30 on the scribe regions 21a may have the same size of different sizes.

Figure 3C:
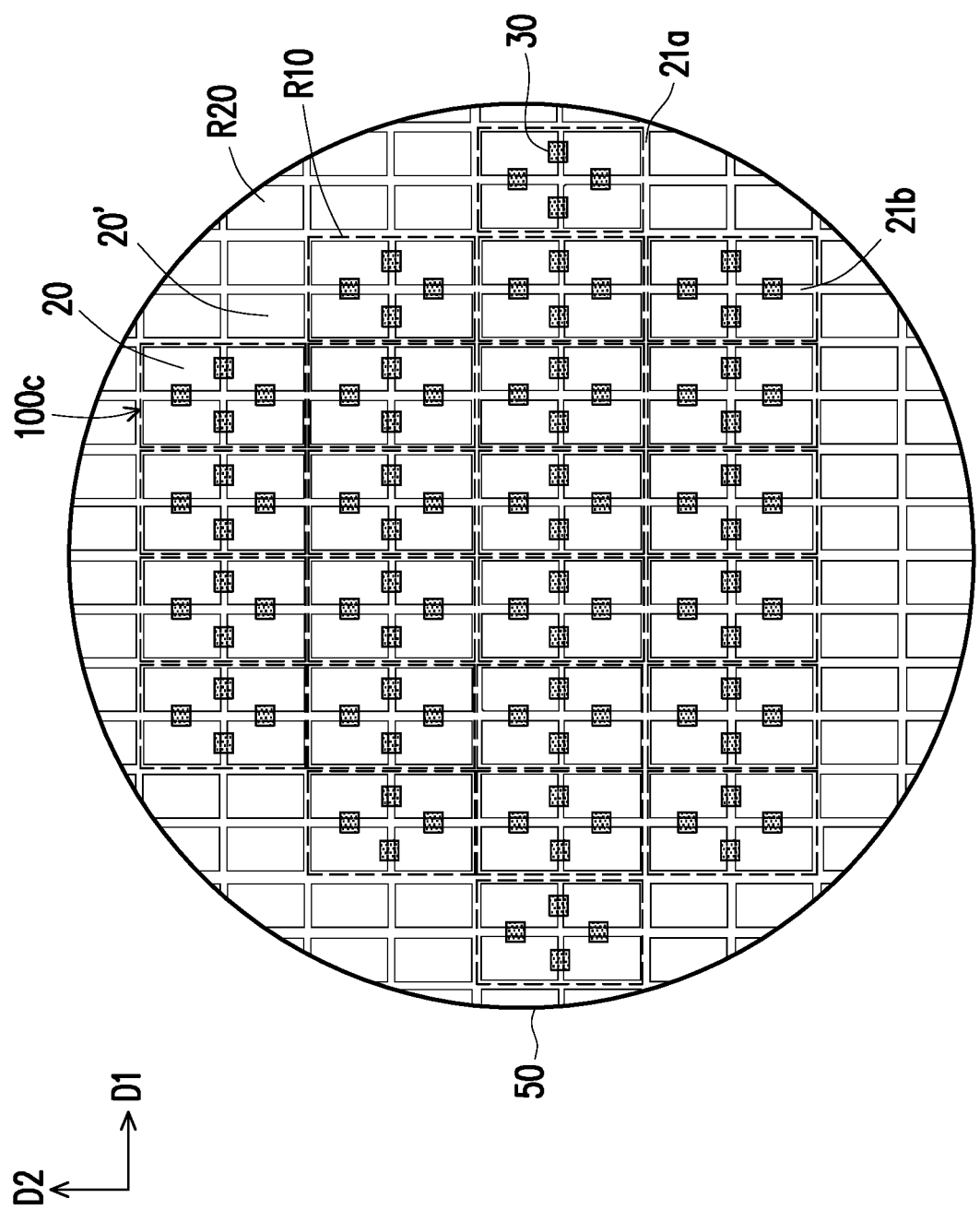
Figure 3D:
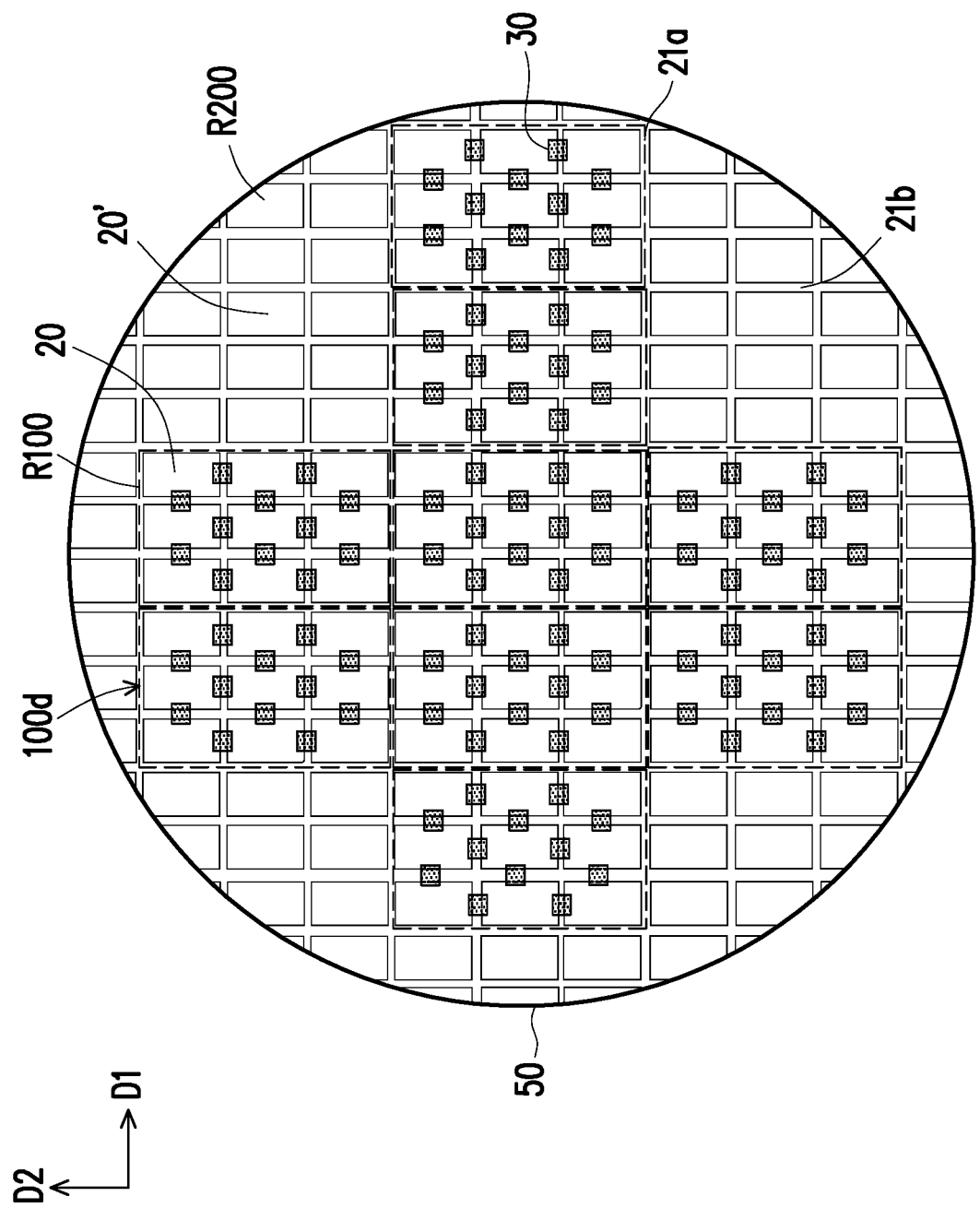

In some embodiments, the dies of the 3DIC structure may be arranged in any kind of array, FIG. 3C and FIG. 3D are examples illustrating dies arranged in different kind of array.

Referring to FIG. 3C, a 3DIC structure 100c including four dies arranged in a 2×2 array is illustrated. A plurality of 3DIC structure 100c may be formed from the wafer 50. Before the wafer is diced, the wafer 50 includes a plurality of first regions R10 and a second region R20. Each first region R10 includes four dies 20 arranged in a 2×2 array. The bonding dies 30 are across the scribe region 21 in the first regions R10. During the die saw process, the 3DIC structure 100c is separated from each other by performing the die saw process on the scribe regions 21 between the first regions R10 and between the first region R10 and the second region R20.

Referring to FIG. 3D, a 3DIC structure 100d includes nine dies arranged in a 3×3 array is illustrated. A plurality of 3DIC structure 100d may be formed from the wafer 50. Before the wafer 50 is diced, the wafer 50 includes a plurality of first regions R100 and a second region R200. Each first region R100 includes nine dies 20 arranged in a 3×3 array. The bonding dies 30 are across the scribe region 21 in the first regions R100. During the die saw process, the 3DIC structure 100c is separated from each other by performing the die saw process on the scribe regions 21 between the first regions R100 and between the first region R100 and the second region 8200.

Figure 3E:
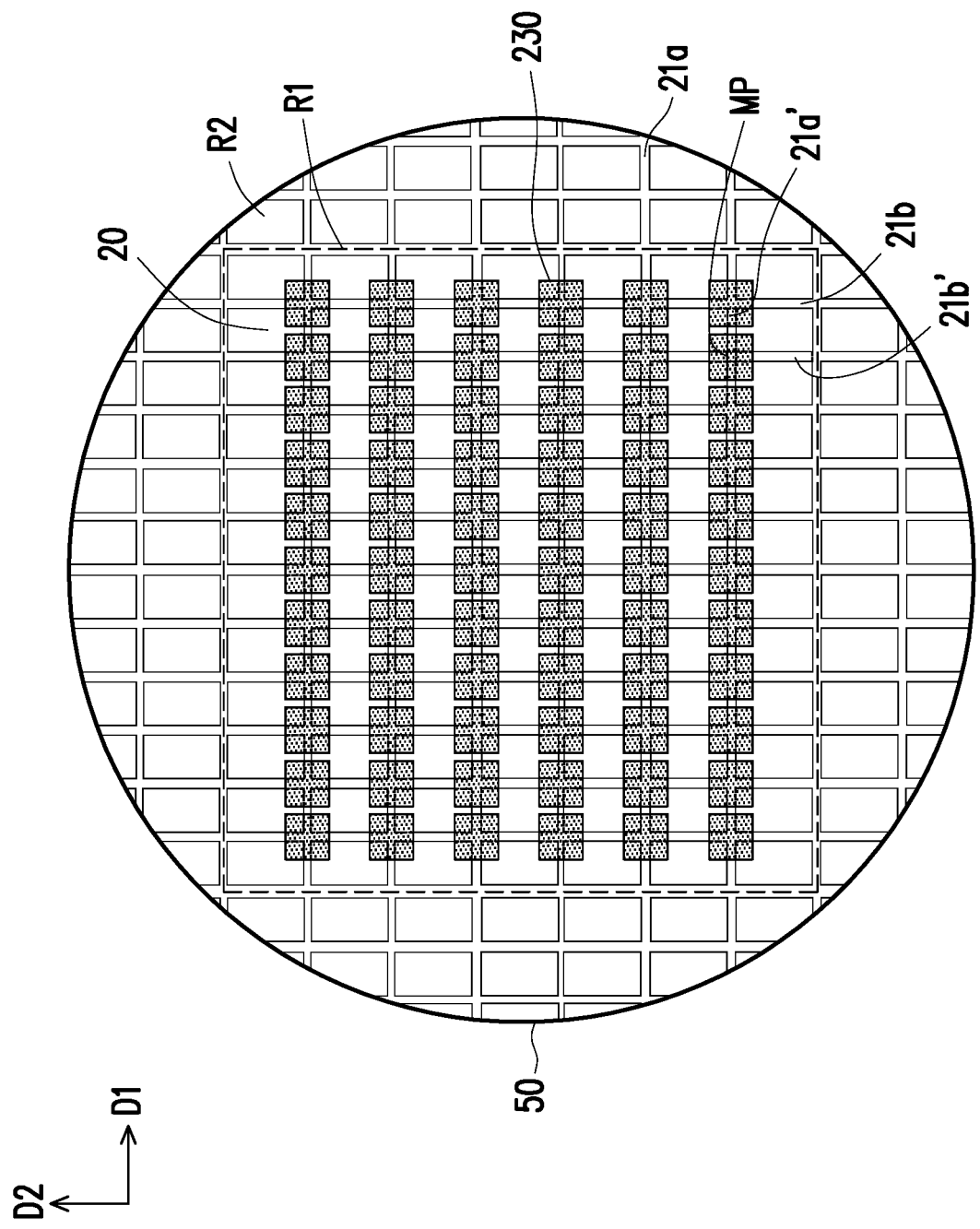

Referring to FIG. 3E, in some embodiments, a 3DIC structure 100e includes a plurality of dies 20 electrically bonded to the bonding dies 230. Each bonding die 230 is bonded to four dies 20 in a 2×2 array, across and covers the crisscross portions of the scribe region 21. In detail, each of the bonding die 230 covers the cross point MP and portions of the first sections 21a' and the second sections 21b' connected to the cross point MP. The dies 20 shown in FIG. 3E are arranged in a 12×7 array, but the disclosure is not limited thereto.

The array of the dies 20 arranged is not limited to those shown in FIGS. 3A to 3E. The 3DIC structure may include dies arranged in any kind of array or single row or single column, or the like, as long as the dies in the 3DIC structure are electrically connected to each other. In some embodiments, one or more 3DIC structures is/are formed from one wafer, and the 3DIC structures formed from the same wafer may include dies arranged in the same type of arrangement (such as array) or different types of arrangements.

In the embodiments of the disclosure, the dies in the 3DIC structure are electrically connected to each other through the bonding die. One bonding die is bonded to at least two dies by hybrid bonding process and across the scribe region between the dies. The bonding die includes metal interconnection comprising metal lines with fine pitch. Therefore, the bonding dies may provide local high density interconnect between the dies, and ultra large die interconnection may be formed.

In some embodiments of the disclosure, a package structure includes a substrate, a first die, a second die and a bonding die. The substrate includes scribe regions and die regions. The die regions are spaced from each other by the scribe regions therebetween. The first die and the second die are within the die regions of the substrate. The bonding die is electrically bonded to the first die and the second die. The top surfaces of the first die and the second die are partially covered by the bonding die.

In alternative embodiments of the disclosure, a package structure includes a substrate, a plurality of dies, a plurality of bonding dies, a gap fill structure and a plurality of through dielectric vias. The substrate includes scribe regions and die regions. The die regions are spaced from each other by the scribe regions therebetween. The dies are within the die regions of the substrate. The bonding dies are disposed on and electrically bonded to the dies. The gap fill structure is on the substrate and laterally aside the bonding dies. The through dielectric vias penetrate through the gap fill structure to connect to the dies.

In alternative embodiments of the disclosure, a package structure includes a plurality of dies and a plurality of bonding dies. The dies are within die regions of a substrate and spaced from each other by scribe regions of the substrate. The bonding dies are across the scribe regions and electrically bonded to the dies. The scribe regions are remained in the package structure, and the bonding dies cover portions of the top surfaces of the scribe regions and the dies.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
    a substrate comprising scribe regions and die regions, the die regions are spaced from each other by the scribe regions therebetween;
    a first die and a second die within the die regions of the substrate, wherein the first die comprises a first dielectric structure and a first bonding pad embedded in the first dielectric structure, the second die comprises a second dielectric structure and a second bonding pad embedded in the second dielectric structure; and
    a bonding die, comprising a dielectric layer and third bonding pads embedded in the dielectric layer, wherein the bonding die is bonded to the first die and the second die through electrically bonding the third bonding pads to the first bonding pad and the second bonding pad, and bonding the dielectric layer to portions of the first dielectric structure and the second dielectric structure,
    wherein top surfaces of the first die and the second die are partially covered by the bonding die.

2. The package structure of claim 1, wherein the scribe region between the first die and the second die is remained in the package structure and partially covered by the bonding die.

3. The package structure of claim 2, wherein the bonding die has a size less than a size the first die or the second die.

4. The package structure of claim 1, wherein the substrate comprises a semiconductor material, and the bonding die is overlapped with the substrate is a direction perpendicular to a top surface of the bonding die.

5. The package structure of claim 1, wherein the bonding die is bonded to the first die and the second die through a hybrid bonding structure.

6. The package structure of claim 1, wherein the substrate is a continuous substrate extending from the die regions to the scribe regions.

7. The package structure of claim 1, further comprising a gap fill structure disposed aside the bonding die and covering portions of the top surfaces of the first die and the second die.

8. A package structure, comprising:
    a substrate comprising scribe regions and die regions, the die regions are spaced from each other by the scribe regions therebetween;
    a plurality of dies within the die regions of the substrate;
    a plurality of bonding dies, disposed on and electrically bonded to the plurality of dies;
    a gap fill structure on the substrate and laterally aside the plurality of bonding dies; and
    a plurality of conductive through dielectric vias, penetrating through the gap fill structure to electrically connect to the plurality of dies.

9. The package structure of claim 8, wherein top surfaces of the plurality of dies are partially covered by the plurality of bonding dies.

10. The package structure of claim 8, wherein the gap fill structure covers portions of top surfaces of the plurality of dies.

11. The package structure of claim 8, wherein the scribe regions are remained in the package structure, and covered by the plurality of bonding dies and the gap fill structure.

12. The package structure of claim 8, wherein the plurality of bonding dies are arranged in an array.

13. The package structure of claim 8, wherein at least two of the plurality of dies share one of the plurality of bonding dies.

14. The package structure of claim 8, wherein a bottom surface of the gap fill structure is coplanar with bottom surfaces of the plurality of bonding dies.

15. The package structure of claim 8, further comprising a redistribution layer on top surfaces of the plurality of bonding dies and the gap fill structure and electrically connected to the plurality of dies through the plurality of conductive through dielectric vias.

16. A package structure, comprising:
   a plurality of dies within die regions of a substrate, and spaced from each other by scribe regions of the substrate;
   a plurality of bonding dies across the scribe regions and electrically bonded to the plurality of dies; and
   a gap fill structure, disposed over the plurality of dies and laterally aside the plurality of bonding dies, wherein portions of top surfaces of the plurality of dies are covered by and in physical contact with the gap fill structure,
   wherein the scribe regions are remained in the package structure, and the plurality of bonding dies cover portions of top surfaces of the scribe regions and another portions of the top surfaces of the plurality of dies.

17. The package structure of claim 16, wherein one of the plurality of bonding dies is bonded to at least two of the plurality of dies.

18. The package structure of claim 17, wherein the one of the plurality of bonding dies is bonded to four dies of the plurality of dies and cover corners of the four dies.

19. The package structure of claim 16, wherein one of the plurality of dies comprises a bonding structure, and a portion of the bonding structure is bonded to a corresponding bonding die through hybrid bonding.

20. The package structure of claim 19, further comprising:
   a through dielectric via penetrating through the gap fill structure and landing on a conductive structure of the bonding structure.

* * * * *